(12) United States Patent
Bockelman et al.

(10) Patent No.: US 7,777,507 B2
(45) Date of Patent: Aug. 17, 2010

(54) INTEGRATED CIRCUIT TESTING WITH LASER STIMULATION AND EMISSION ANALYSIS

(75) Inventors: Daniel Richard Bockelman, Tigard, OR (US); Yuan-Chuan Steven Chen, Portland, OR (US); Christopher John Brookreson, Saint Helens, OR (US); Md Asifur Rahman, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 281 days.

(21) Appl. No.: 11/691,480

(22) Filed: Mar. 26, 2007

(65) Prior Publication Data

US 2008/0238435 A1    Oct. 2, 2008

(51) Int. Cl.
G01R 31/302    (2006.01)
G01R 31/26    (2006.01)

(52) U.S. Cl. ...................................... 324/752; 324/765
(58) Field of Classification Search .................. 324/752
See application file for complete search history.

(56) References Cited

U.S. PATENT DOCUMENTS

| | | | | |
|---|---|---|---|---|
| 5,465,052 A | * | 11/1995 | Henley | 324/770 |
| 6,285,199 B1 | * | 9/2001 | Kim | 324/752 |
| 6,529,018 B1 | * | 3/2003 | Stevens | 324/750 |
| 6,549,022 B1 | * | 4/2003 | Cole et al. | 324/752 |
| 6,703,850 B2 | * | 3/2004 | Nozoe et al. | 324/751 |
| 7,212,024 B2 | * | 5/2007 | Iwasaki et | 324/770 |
| 2004/0017213 A1 | * | 1/2004 | Witte | 324/752 |

OTHER PUBLICATIONS

Hamamatsu Photonics, "Emission Microscope", [online], at least as early as Mar. 26, 2007, retrieved from the Internet at <URL: http://jp.hamamatsu.com/products/node.do?dir=division/sys/pd273/pd276/phemos...>, 1 pg.

Statement by William Konrad, dated Mar. 22, 2010, concerning "Emission Microscope" web page dated at least as early as Mar. 27, 2007, 2 pg.

* cited by examiner

Primary Examiner—Ha Tran T Nguyen
Assistant Examiner—Roberto Velez
(74) Attorney, Agent, or Firm—Konrad Raynes & Victor LLP

(57) ABSTRACT

A diagnostic tool for testing an integrated circuit device directs a beam of laser energy to stimulate at least a portion of the device. In one mode, electromagnetic waves from said device may be detected at the same time in response to the stimulation. A processor collects image data and determines as a function of the collected image data whether the device has a defect. Other embodiments are described and claimed.

7 Claims, 4 Drawing Sheets

INTEGRATED CIRCUIT TESTING WITH LASER STIMULATION AND EMISSION ANALYSIS

BACKGROUND

A variety of tools have been proposed or used to detect flaws in integrated circuits. The detection and correction process, often referred to as "debugging," includes failure analysis and fault isolation (FAFI). The design of an integrated circuit can often be tested by simulating or emulating the operation of the circuit using computer programs and separate logic components.

An integrated circuit may also be tested by providing a variety of input signals to the input pins of the integrated circuit and observing the output signals provided by the integrated circuit at its output pins in response to the input signals. A circuit having some types of defects may when operated, provide an output signal at an output pin which differs significantly from that provided by an integrated circuit having the same circuit design but known to lack defects. Hence, the output signals at the output pins of an integrated circuit being tested may be noted while the circuit is being operated and the resulting output signals compared to known outputs of known flawed and unflawed circuits to detect whether a flaw exists in the integrated circuit being tested.

In addition to noting the output signals provided at the output pins of an integrated circuit being tested, it is known that a defect in an integrated circuit may provide electromagnetic emissions which differ from the electromagnetic emissions of the same circuit portion in an integrated circuit which is known to lack those defects. For example, FIG. 1 is a schematic diagram of an InfraRed Emission Microscope (IREM) 10 which can detect local switching and leakage currents through the detection of emitted photons. The IREM 10 includes an optical system 12 which includes a primary lens optics 14 which focuses on a particular portion of an integrated circuit device 16 under test. The photon emissions of the integrated circuit portion being operated are collected by the primary lens optics 14 and focused by a secondary lens 18a of a carousel 20 of second lenses 18a, 18b, 18c, onto a sensor array 22. The output signals of the sensor array 22 may be collected by a processor or logic circuit 24 which can compare the images of various portions of the device 16 being tested to corresponding images of known flawed and unflawed circuits to detect whether a flaw exists in the integrated circuit device 16 being tested.

There are additional types of debugging tools. For example, it has been noted that circuit operation may be affected by illuminating a portion of an integrated circuit with a laser beam. Moreover, a circuit having some types of defects being illuminated by a laser may provide an output signal at an output pin which differs significantly from that provided by an integrated circuit having the same circuit design but known to lack defects. Hence, the output signals at the output pins of an integrated circuit may be noted while the circuit is being operated and illuminated by a laser and the resulting outputs at the circuit output pins compared to known output signals at the output pins of flawed and unflawed circuits to detect whether a flaw exists in the integrated circuit being tested.

FIG. 2 is a schematic diagram of a Laser Assisted Device Alteration (LADA) debugging tool 28 which includes a laser source 30 and a scanning optical system 32 which can focus the laser beam 34 using an objective lens 36, on a particular portion of the integrated circuit device 38 being tested. A scanning mirror 40 of the optically system 32 can direct the laser beam 34 to illuminate the desired locations of the device 38. The output signals at the output pins of the device 38 may be collected by a processor or logic circuit 42 while the integrated circuit is being operated and illuminated by the laser 30. The logic circuit 42 can compare the resulting outputs at the circuit output pins of the device 38 to known output signals at the output pins of flawed and unflawed circuits to detect whether a flaw exists in the integrated circuit device 38 being tested. A mirror 50 can split the laser beam 34 to provide a sample beam 34a which is directed by other mirrors such as mirror 52 to a sensor 54, the output of which may be used to regulate the power of the laser 30.

DETAILED DESCRIPTION OF THE DRAWINGS

In the following description, reference is made to the accompanying drawings which form a part hereof and which illustrate several embodiments. It is understood that other embodiments may be utilized and structural and operational changes may be made without departing from the scope of the present description.

Figure 2:
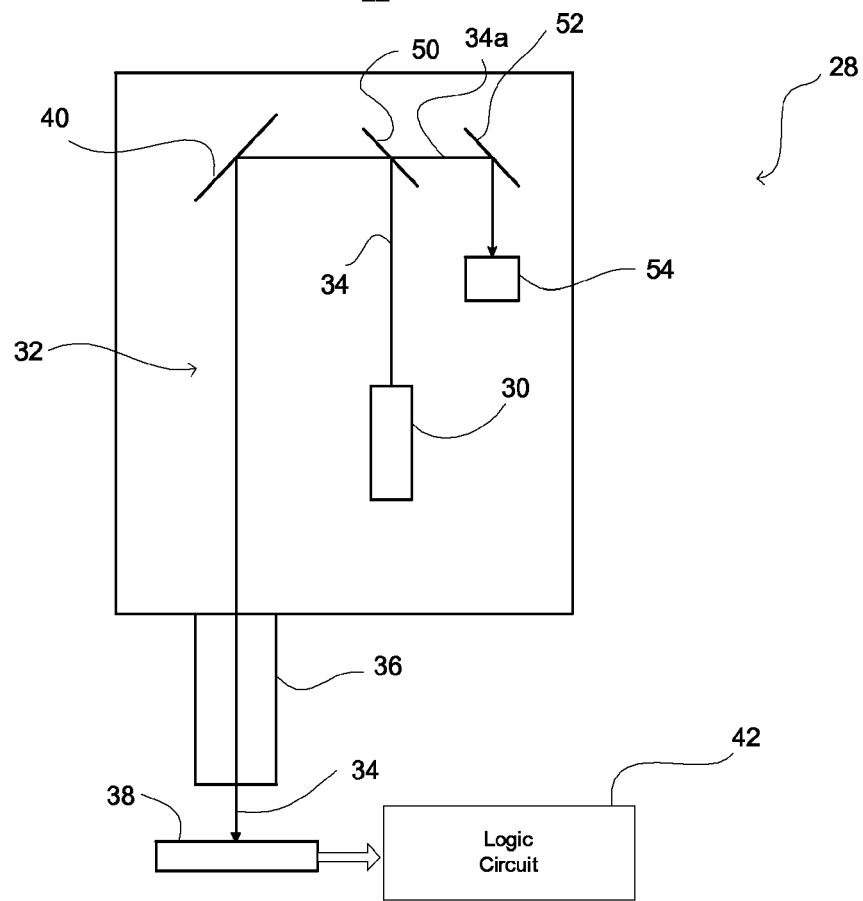
FIG. 2 is a schematic diagram of a prior art Laser Assisted Device Alteration (LADA) debugging tool
Figure 3:
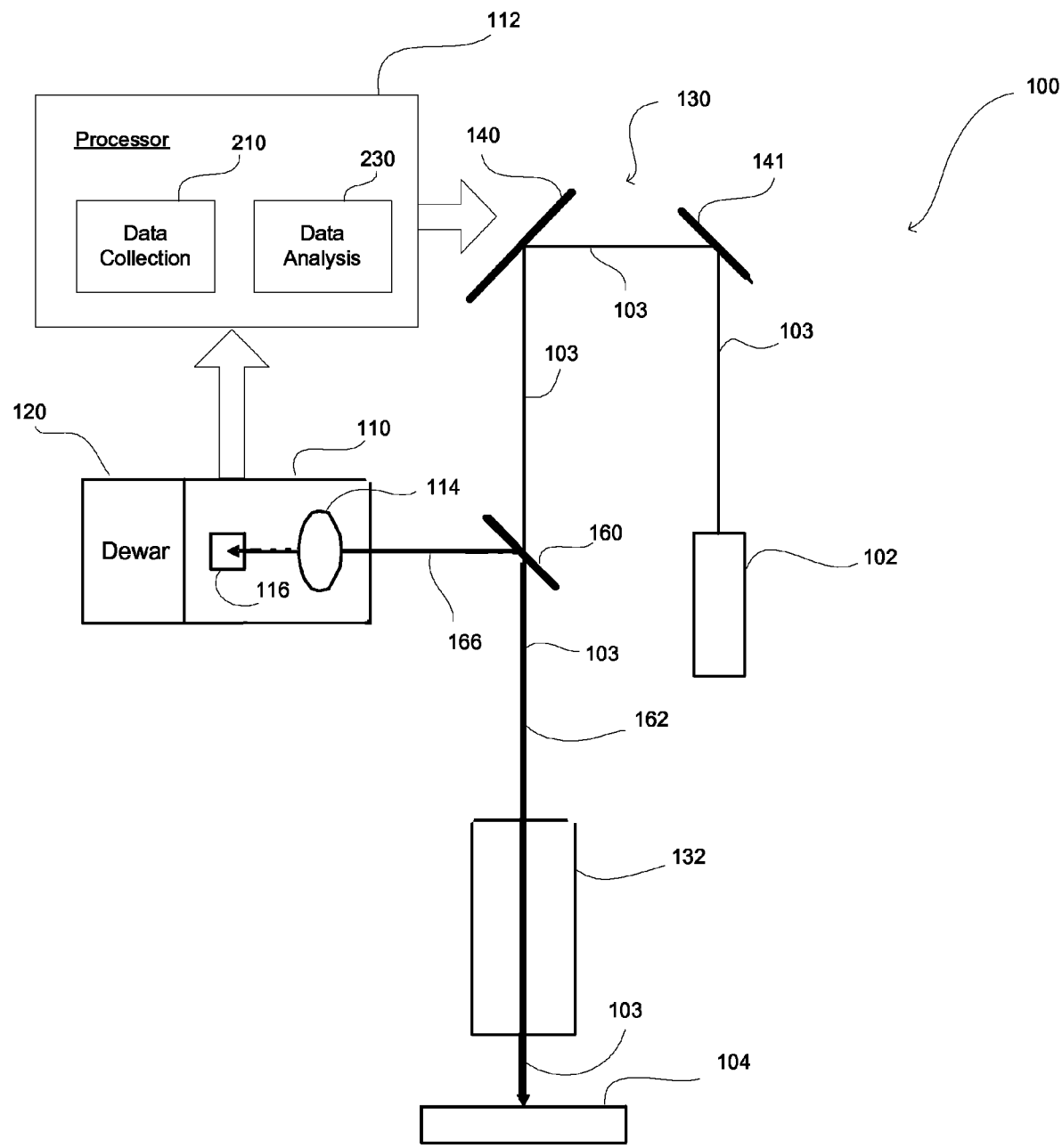
FIG. 3 is a schematic diagram of an integrated circuit device diagnostic tool in accordance with one embodiment of the present description.

A diagnostic tool in accordance with one embodiment of the present description, for testing integrated circuit devices, is indicated generally at 100 in FIG. 3. The tool 100 includes a laser source 102 comprising a laser which provides a beam 103 of laser energy to stimulate at least a portion of an integrated circuit device, such as the device 104, for example, for purposes of testing the device 104. In the illustrated embodiment, the laser source 102 includes a yttrium aluminum garnet (YAG) laser which emits laser energy in the infrared range such as 1064 nm or 1340 nm, for example. It is appreciated that a variety of types of laser devices may be used, depending upon the particular application. For example, the laser source 102 may be similar to the laser source 30 of FIG. 2.

The tool 100 further includes an image detector 110 which detects photons or electromagnetic waves emanating from the device 104 in response to stimulation of the device by the illumination of the device by the laser source 102. A logic circuit or processor 112 is coupled to the output of the image detector 110 and provides an indication based on the detector output, as to whether the device has a defect, speedpath or other limitation on the functionality or quality of the device. As explained in greater detail below, such an arrangement is believed to facilitate testing of integrated circuit devices. The processor 112 may be dedicated or programmable logic circuits, a general purpose computer, software, hardware, firmware or other logic.

Figure 1:
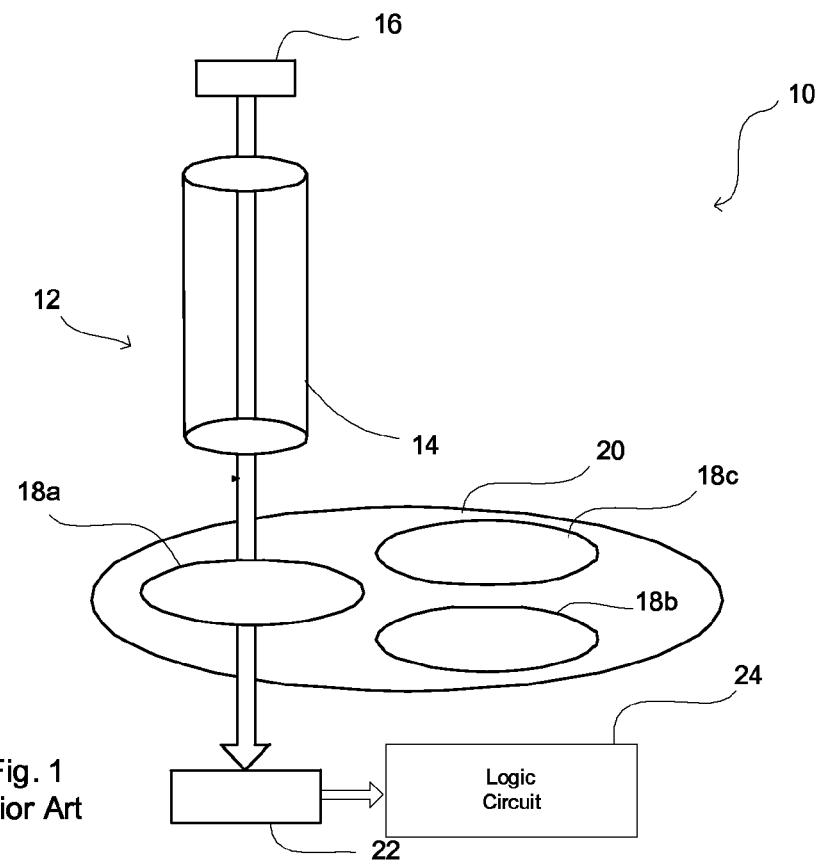
FIG. 1 is a schematic drawing of a prior art InfraRed Emission Microscope (IREM) tool.

In the illustrated embodiment, the image detector 110 includes a filter 114, such as a band reject filter, to remove at least a portion of any laser energy reflected from the device 104. However, the filter 114 passes to a sensor array 116 at least a portion of electromagnetic waves emitted by the device 104 in response to the stimulation of the device 104 by the laser source 102 so that the operation of the device 104 may be evaluated as a function of the photon emissions of the device while operated. It is appreciated that other types of filters may be used, depending upon the particular application. Also, the filter may be eliminated in some applications. For example, the image detector 110 may be similar to the detector 22 of FIG. 1.

Figure 4:
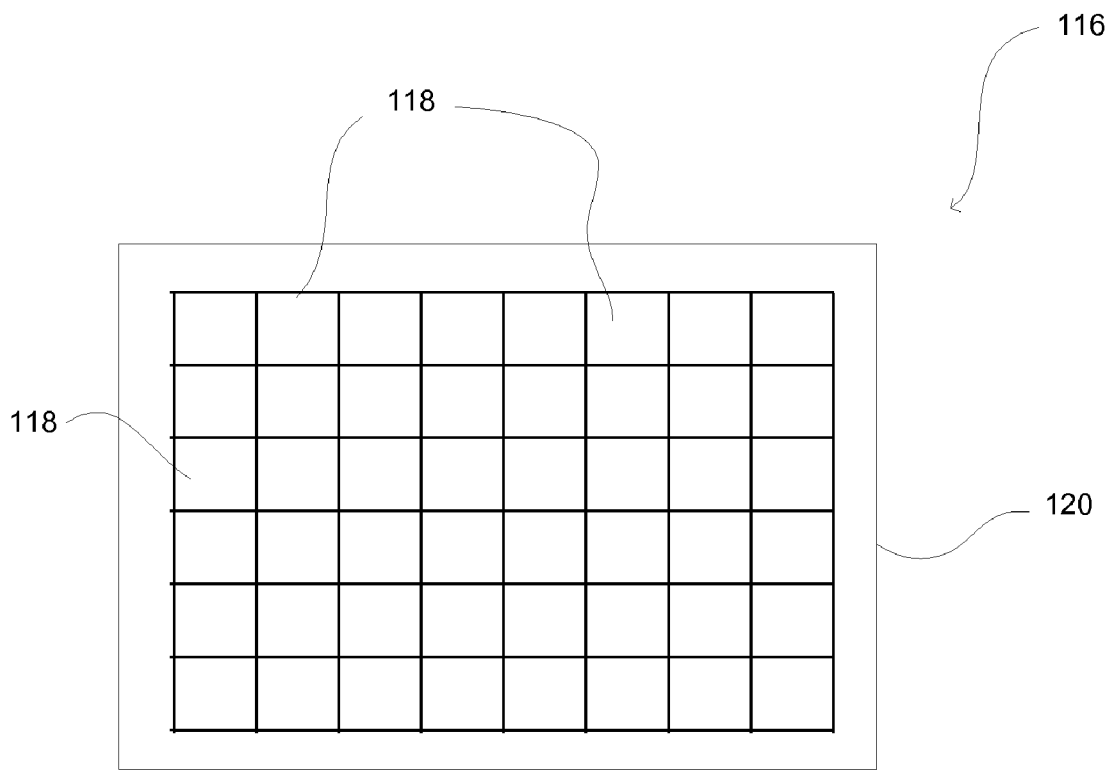
FIG. 4 is a schematic diagram of a sensor for the diagnostic tool of FIG. 3.

FIG. 4 is a schematic diagram of the sensor array 116 which includes a plurality of photosensitive elements 118 arranged in a rectangular matrix. In one embodiment, the sensor array 116 includes 320 columns of photosensitive elements 118 arranged in 256 rows of photosensitive elements 118. It is appreciated that the shape of the array of elements 118 and the size of the array may vary depending upon the particular application.

Each photosensitive element 118 is, in the illustrated embodiment, an Indium Gallium Arsenide (InGaAs) detector which is sensitive to electromagnetic radiation in the 800-1500 nm range. Other types of photosensitive elements may be used, depending upon the particular application. Thus, for example, the wavelengths to which the photosensitive elements 118 respond may vary, depending upon the particular application. The photosensitive elements 118 are cooled in a dewar flask 120 to improve sensitivity and reduce the noise level of the outputs of the elements 118. Other techniques may be used as well.

In the illustrated embodiment, the tool 100 further comprises an optical apparatus 130 which includes a lens 132 which permits the laser beam 103 to be focused onto a particular portion of the device 104 under test. In the illustrated embodiment, the lens 132 is a Nikon objective 0.85 na (100×) lens. Another suitable lens is a liquid immersion 200×, 1.4 na objective lens. It is appreciated that other types of lenses may be used, depending upon the particular application.

Figure 5:
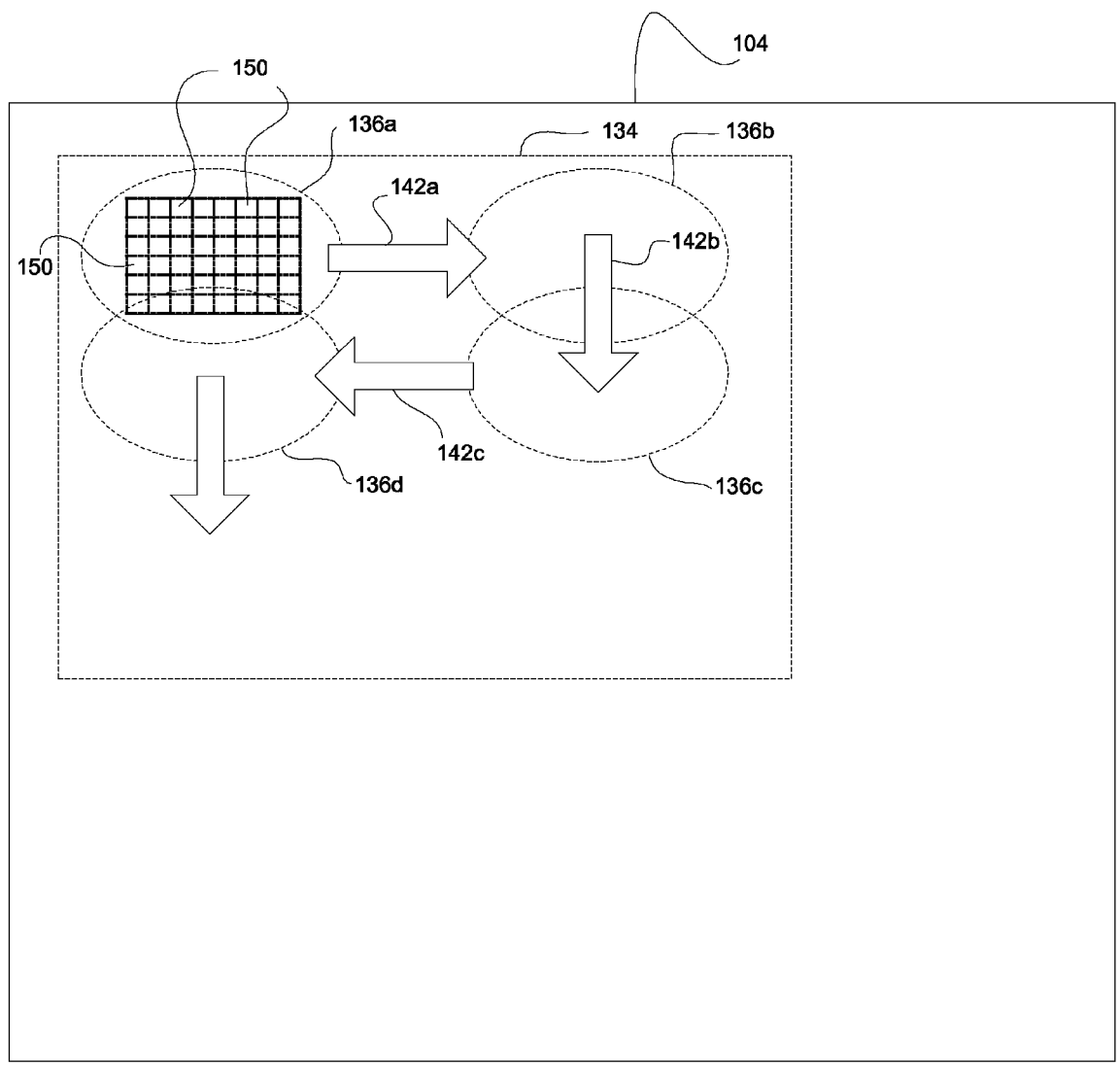
FIG. 5 is a schematic diagram illustrating scanning of an integrated circuit device using the diagnostic tool of FIG. 3.

FIG. 5 is a schematic diagram illustrating the integrated circuit 104 having a portion 134, for example, which may be scanned to test that particular portion 134. A dotted oval 136a represents the laser beam 103 being focused to illuminate the device portion 134 within the oval 136. In this example, the optical apparatus 130 further includes a scanning mirror 140 (FIG. 3) which receives the laser beam 103 from a mirror 141 which reflects the laser beam from the laser source 102 to the scanning mirror 140.which permits the laser beam 134 to scan the remainder of the device portion 134.

For example, the laser beam 134 may be scanned left to right as represented by the arrow 142a to a new position as represented by the dotted oval 136b. Still further, the laser beam 134 may be scanned orthogonally as represented by the arrow 142b to a new position as represented by the dotted oval 136c. The laser beam 134 may be scanned right to left as represented by the arrow 142c to a new position as represented by the dotted oval 136d, and so on. In this manner, a selected portion of the integrated circuit device may be raster scanned by the laser beam 134 to illuminate and stimulate that portion with photons. It is appreciated that other scanning techniques may be utilized including variable angle vector scanning, spiral scanning, and so on. For example, the scanning mirror 130 and objective lens 132 of the optical apparatus 130 may be similar to the scanning mirror 40 and objective lens 36 of FIG. 2.

At each position illuminated by the laser beam 134, the sensor array 116 can detect the photons being emitted from each of a matrix of locations 150. In this manner, the photons emitted at each location 150 may be detected by an associated element 118 of the sensory array 116.

The optical apparatus 130 further includes a one way mirror 160 (FIG. 3) which permits the laser beam 103 from the scanning mirror 140 to pass through the one-way mirror 160 to be focused by the objective lens 132 onto the device 104. Thus, the tool 100 defines an optical path 162 between the one-way mirror 160 and the device 104 and including the objective lens 132. Photons being emitted by the device 104 may follow the same optical path 162 back through the objective lens 132 to the one-way mirror 160. The photons from the device 104 are reflected by the one-way mirror 160 to another optical path 166 to the image detector 110.

Thus, in accordance with another aspect of the present description, the tool 100 may use the same optical apparatus 130 including the objective lens 132 both for scanning the laser beam over the device 104 and for scanning the device 104 to collect the photons emitted by the portion of the device 104 being scanned by the optical apparatus 130. The objective lens 130 can focus the laser beam on a particular location of the device 104 to stimulate that particular location. Moreover, the objective lens 130 can magnify the image of the device 104 to focus the photons emitted by a particular region of the device 104 and direct those photons back to the one-way mirror 160 to be reflected to the image detector 110.

Figure 6:
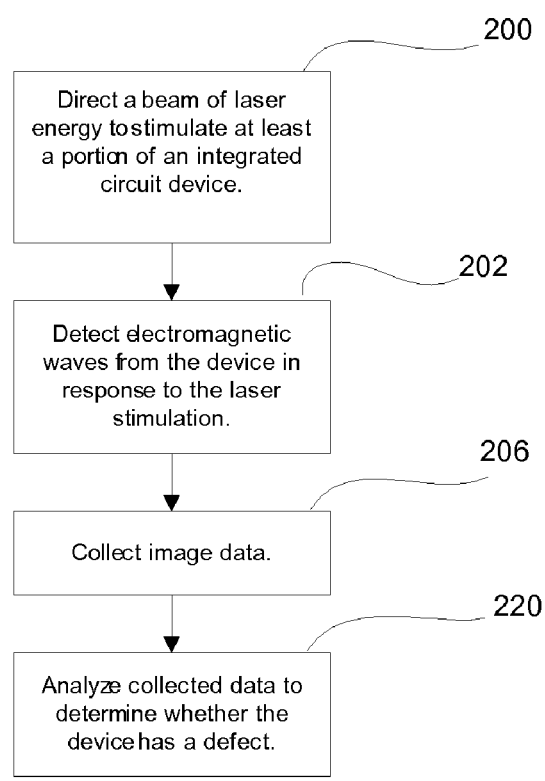
FIG. 6 illustrates one example of operations of the diagnostic tool of FIG. 3.

FIG. 6 illustrates one example of operations to test and analyze an integrated circuit device. In one operation, a beam of laser energy is directed (block 200) to stimulate at least a portion of the device being tested. In the illustrated embodiment, for example, the laser beam 103 can be scanned by the optical apparatus 130 over an array of locations of a region of the device as shown in FIG. 5. In some tests, the device 104 may be powered while scanned by the laser beam. For such tests, the powered device may be operated or may be idle, depending upon the particular test. For other tests, the device may be unpowered while scanned by the laser.

In another operation, electromagnetic waves or photons emitted by the device in response to the stimulation of the device may be detected (block 202). In the illustrated embodiment, a collection of data representing the output signals of the sensor array 116 may be collected (block 206) by a data collection logic 210 of the processor 112, for each location 150 of the array of locations while the laser beam 103 is scanned over the region 134. Each output signal of the sensor array 116 may be in the form of an intensity value of the photons striking a sensor of the sensory array 116 where the measured photons have a wavelength within the range of wavelengths to which the sensor is sensitive.

The intensity values of the outputs of the sensor array 116 may be collected by the processor 112 to provide an image of the region of the device being scanned. Each picture element or pixel of the image represents the intensity of the photons being emitted by the device 104 at a location 150. The photons emitted at each location 150 are sensed by a corresponding sensor 118 of the sensor array 116. As set forth above, the device may be scanned with a laser beam 103 while image data is collected.

It is recognized that in some tests, image data may be collected without stimulating the device with the laser beam 103. Such images may result from the emission of photons by the device 102 while the device 104 is powered, for example, either while operated or idle, depending upon the particular tests being run.

Conversely, it is recognized that in some tests, the test device 104 may be stimulated by the laser beam 103 without collecting image data through the image detector 110. Instead, the response of the device to the laser stimulation may be measured by other devices including oscilloscopes and logic circuits responsive to output signals coupled to output pins of the device 102 being tested. In yet other tests, the test device 104 may be stimulated by the laser beam 103 while both collecting image data through the image detector 110 and collecting output signal data from the output pins of the device 104 being tested. It is believed that a tool 100 in accordance with the present description can provide capabilities for running a wide variety of tests on the device 104. It is appreciated that other applications of a tool in accordance with the present description may have other features, depending upon the particular application of the tool.

Once sufficient data has been collected, a determination may be made (block 220) as to whether the device 104 has a defect. In the illustrated embodiment, the processor 210 includes logic 230 to perform various analyses with respect to the collected data.

As indicated above, the tool 100 may be operated in a variety of modes and test procedures. For example, in one test procedure, the laser beam 103 may be scanned over a region of a powered or unpowered device 104. At the same time that the device 104 is being illuminated by the laser beam 103, the infrared emissions of the illuminated region are detected by the image detector 110 and the image data for that region is collected by the processor 112. The image data for a particular region may be referred to as an "emission signature" for that region. The emission signature can then be compared to predetermined values such as the emission signature of the same region of a known passing unit (no substantial defect) and also to the emission signature of the same region of a known failing unit (has substantial defect) to determine the location or locations of any defects on the unit being tested.

For example, a defect might cause additional leakage current. A laser beam illuminating such a defect may change the current through that device element more than if the device element did not have the defect. Such an increase in leakage current may be indicated in the image data because increased current can cause additional emission of photons.

As another example, the laser beam 103 may be scanned over a region of a powered device 104, while at the same time the infrared emissions are detected by the image detector 110 and the image data for that region is collected by the processor 112. In addition, infrared emissions can be detected by the image detector 110 and the image data for that region can be collected a second time by the processor 112 but this time the laser source 102 may be turned off while the emissions are detected and the image data is collected. The image data collected while the laser source is on may be compared by subtracting that image data from the image data collected while the laser was off to determine if there is a difference in emissions with and without the laser illumination. Locations which show high differences in the two sets of image data could indicate defect locations on the die of the device 104 being tested.

In yet another example, rather than scanning the laser beam over a relatively large region of the device 104, the laser beam 103 may be "parked" on a specific circuit element or circuit of the device 104 so that the specific element or circuit is continuously illuminated by the laser beam 103 while a test is run using a device tester which may be coupled to the output pins of the device 104, for example. The infrared emission data may be captured and used to determine the logic states of various internal logic elements of the device being tested.

One example in which the detection of internal logic states may be utilized is to identify speedpaths, that is, signal paths which limit the overall frequency of operation of the device. Other tests may be formulated using such logic state detection.

It is appreciated that a variety of other types of tests may be performed on an integrated circuit device utilizing a diagnostic tool in accordance with the present description such as the tool 100.

The illustrated operations of FIG. 6 shows certain events occurring in a certain order. In alternative embodiments, certain operations may be performed in a different order, modified or removed. Moreover, operations may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to limit the embodiments to the precise form disclosed. Many modifications and variations are possible in light of the above teaching.

What is claimed is:

1. A method of testing an integrated circuit device, comprising:
    directing a beam of laser energy to stimulate at least a portion of said device to emit electromagnetic waves in response to said laser energy stimulation wherein said laser beam directing includes scanning a laser beam over an array of locations of a region of said device;
    detecting said electromagnetic waves emitted from said device in response to said stimulation using a sensor array wherein said detecting includes collecting a first collection of outputs of said sensor array for each location of said array of locations while said laser beam is scanned over said region, and collecting a second collection of outputs of said sensor array for each location of said array of locations without scanning said laser beam over said region; and
    determining as a function of said detecting of electromagnetic waves emitted from said device in response to said stimulation whether said device has a defect wherein said determining includes comparing a sensor array output for a particular device location of said first collection to a sensor array output of said second collection for said particular device location to determine if said device has a defect at the particular device location and wherein said determining includes comparing a sensor array output for a particular device location to a predetermined value to determine if said device has a defect at the particular device location.

2. The method of claim 1 wherein said detecting includes:
    filtering said electromagnetic waves from said device to remove at least a portion of any laser energy reflected from said device and to pass at least a portion of electromagnetic waves emitted by said device in response to said stimulation.

3. The method of claim 1 wherein said laser beam directing includes directing a laser beam at a particular circuit of said device wherein the particular circuit is operable in a plurality of logic states, said detecting includes collecting a collection of outputs of said sensor array for an array of locations of said particular circuit, and said determining includes determining the logic state of the particular circuit and includes comparing an emission signature output by the sensor array output for a particular device location to a predetermined emission signature to determine if said device has a defect at the particular device location.

4. A tester for testing integrated circuit devices, comprising:
- a laser adapted to provide a beam of laser energy;
- an optical apparatus which includes a scanning mirror and a focusing lens adapted to scan a laser beam of said laser over an array of locations of a region of said device to stimulate at least a portion of said device to emit electromagnetic waves in response to said laser energy stimulation;
- a detector which includes a sensor array adapted to detect electromagnetic waves emitted from said device in response to said stimulation; and
- a logic circuit responsive to said detector and adapted to provide an indication as to whether said device has a defect as a function of said detector wherein said logic circuit is adapted to collect a first collection of outputs of said sensor array for each location of said array of locations while said laser beam is scanned over said region, and collect a second collection of outputs of said sensor array for each location of said array of locations without scanning said laser beam over said region, and compare a sensor array output for a particular device location of said first collection to a sensor array output of said second collection for said particular device location to determine if said device has a defect at the particular device location as a function of said comparison and wherein said logic circuit is adapted to compare a sensor array output for a particular device location to a predetermined value to determine if said device has a defect at the particular device location as a function of said comparison.

5. The tester of claim 4 wherein said detector includes a filter adapted to filter said electromagnetic waves from said device to remove at least a portion of any laser energy reflected from said device and to pass at least a portion of electromagnetic waves emitted by said device in response to said stimulation.

6. The tester of claim 4 wherein said optical apparatus further comprises a second mirror adapted to transmit a laser beam from said laser to said device and to reflect electromagnetic waves from said device to said detector.

7. The tester of claim 4 wherein said logic circuitry is further adapted to collect a collection of outputs of said sensor array for an array of locations of a particular circuit while a laser beam is directed at said particular circuit of said device, determine the logic state of the particular circuit as a function of said collection of outputs, and compare an emission signature output by the sensor array output for a particular device location to a predetermined emission signature to determine if said device has a defect at the particular device location.

* * * * *